United States Patent [19]

Carlson et al.

[11] Patent Number: 4,611,478
[45] Date of Patent: Sep. 16, 1986

[54] LOCKING RING ASSEMBLY

[75] Inventors: John H. Carlson, West Boylston; Anthony J. Agbay, Auburn, both of Mass.

[73] Assignee: Omco Inc., Holden, Mass.

[21] Appl. No.: 646,233

[22] Filed: Aug. 31, 1984

[51] Int. Cl.$^4$ .................. G01R 11/04; E05B 73/00
[52] U.S. Cl. ................................. 70/164; 292/256.6
[58] Field of Search ............ 70/158, 163, 164, 166, 70/167–169, 170, 171, 259, 260; 292/256, 256.5, 256.6, 258; 16/234, 254, 260, 263, 268, 270, 271, 272

[56] References Cited

U.S. PATENT DOCUMENTS

| | | | |
|---|---|---|---|
| 1,881,467 | 10/1932 | Ganz | 70/260 |
| 3,867,822 | 2/1975 | Morse | 70/164 |
| 4,222,609 | 9/1980 | Anderson | 16/270 |
| 4,415,190 | 11/1983 | Finck | 292/256.6 |

Primary Examiner—Robert L. Wolfe
Attorney, Agent, or Firm—Thompson, Birch, Gauthier & Samuels

[57] ABSTRACT

For use with an electric meter having a flanged receptacle for holding the meter works and a flanged glass bowl for covering the meter works, a locking ring assembly consisting of a two-piece circular locking ring having two substantially semicircular sections for locking the glass bowl to the receptacle. One of the semicircular sections has a hinge fitting at one end and a radially extending leg at the other end. The other semicircular section has a mating hinge fitting at one end and a radially extending mating leg at the other end. The fittings are hingedly attached so that the two sections can be pivotally spread apart about the hinge axis of the fitting. This hinged connection permits the sections to be manually spread apart and easily applied over and around the flanges of the meter receptacle and the glass bowl. The radially extending mating legs have circular openings which are in axial alignment when the legs are drawn towards each other for clamping the glass bowl to the receptacle. When the legs are drawn towards each other, tension is exerted on the hinged connection. The tension on the hinged connection holds the ring sections together in an interlocked arrangement and hampers unauthorized access to the meter works.

12 Claims, 13 Drawing Figures

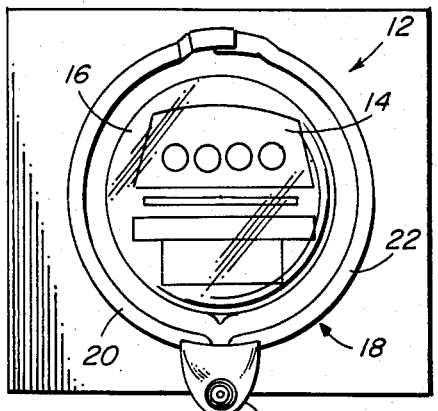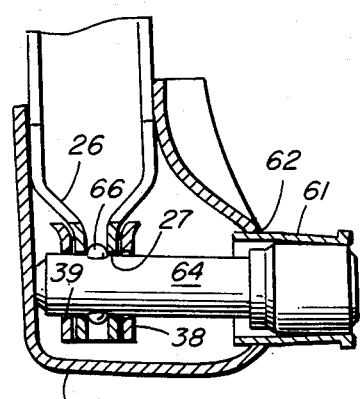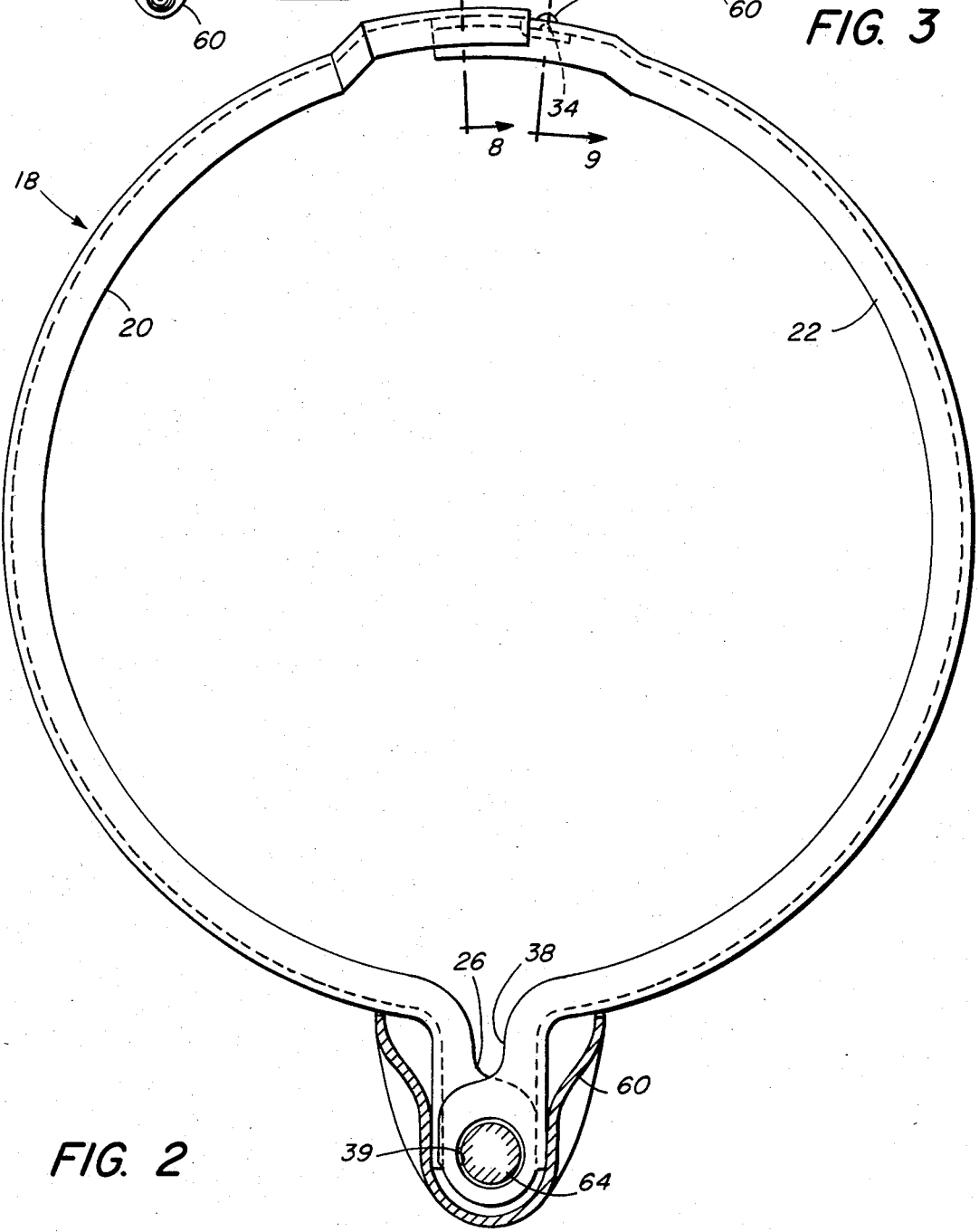

LOCKING RING ASSEMBLY

BACKGROUND OF THE INVENTION

The meter mechanism of a conventional electric meter is supported by a meter receptacle having a flanged front aperture. To protect the meter mechanism, a glass blowl with a circular flange is positioned against the meter receptacle so that the glass bowl covers the meter mechanism and the flanges of the glass bowl and the meter receptacle mate. A one-piece locking ring is provided to encircle both flanges in order to hold and clamp the glass bowl to the meter receptacle. The locking ring has a U-shaped cross section which fits over both the glass bowl flange and the receptacle flange as shown in U.S. Pat. Nos. 1,158,953 and 4,413,490. Because the locking ring is a one-piece circular member with a U-shaped cross section, installers have encountered difficulty in spreading the locking ring apart to place it over the glass bowl and meter receptacle flanges.

SUMMARY OF THE INVENTION

It is an object of this invention to provide a meter locking ring assembly which is easily installed by authorized personnel and difficult for vandals to remove.

It is another object of this invention to provide a meter locking ring assembly consisting of a two-piece locking ring which is hingedly connected in such a manner that it is easily spread apart to facilitate installation and is not easily removed by unauthorized personnel.

The locking ring has two substantially semicircular sections. One section has a hinge fitting at one end and a radially extending leg at the other end. The other section has a mating hinge fitting at one end and a radially extending mating leg at the other end. The two fittings are hingedly attached permitting the locking ring sections to be pivotally spread apart about the hinge axis of the fittings and applied over and around the butted flanges of the glass bowl and the meter receptacle. The extending mating legs are provided with circular openings, the axes of which are parallel to the axis of the ring and are in axial alignment with each other when the legs are drawn together to clamp the glass bowl to the receptacle. A protective housing is fitted over the mating legs. A barrel lock is inserted into the aligned circular openings to lock the housing to the two-piece ring. The housing, when secured by the barrel lock to the clamped two-piece ring, prevents unauthorized access to the interior of the housing. The hinged arrangement of the interconnected sections is such that, when the legs are pulled together, tension is exerted on the hinge fittings which makes it very difficult for vandals to remove the locking ring assembly.

DESCRIPTION OF THE DRAWINGS

FIG. 1 is a front elevation of the hinged locking ring assembly of the invention. The locking ring assembly is shown locked in place on an electric meter.

FIG. 2 is a front elevation of the hinged locking ring of FIG. 1. This view shows the hinge sections of the locking ring connected in a hinged arrangement and the protective housing fitted over the mating legs.

FIG. 3 is a sectional view taken along the line 3—3 in FIG. 2.

DETAILED DESCRIPTION OF THE PREFERRED AND ALTERNATIVE EMBODIMENTS

Figure 4:
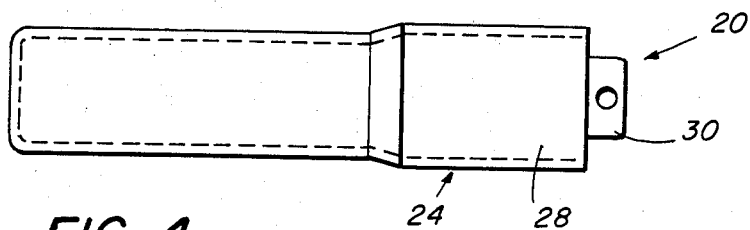
FIG. 4 is a top view of the hinge section which has the male fitting at one end.

FIG. 1 shows a conventional electric meter having a meter receptacle 12 supporting the meter mechanism (with recording dials) 14. The meter receptacle has a front aperture which is surrounded by a circular flange. To protect the meter mechanism, a glass bowl 16 with a circular flange is positioned against the meter receptacle 12 so that the facing circular flanges of the glass bowl and meter receptacle mate. A circular two-piece locking ring 18, made in accordance with the preferred embodiment of the invention, is provided to encircle and clamp the glass bowl 16 to the meter receptacle 12.

The two-piece locking ring 18 has a semicircular hinge section 20 and a semicircular hinge section 22, each section having a U-shaped cross section. The ends of the hinge sections are interconnected in a hinged arrangement so that the two-piece locking ring 18 can be spread apart easily for installation on the mating flanges of the glass bowl and meter receptacle flanges. The locking ring 18 is preferably composed of a casehardened metal which resists cutting or hacksawing. The locking ring is also preferably plated with cadmium and chromate for corrosion resistance.

Figure 5:
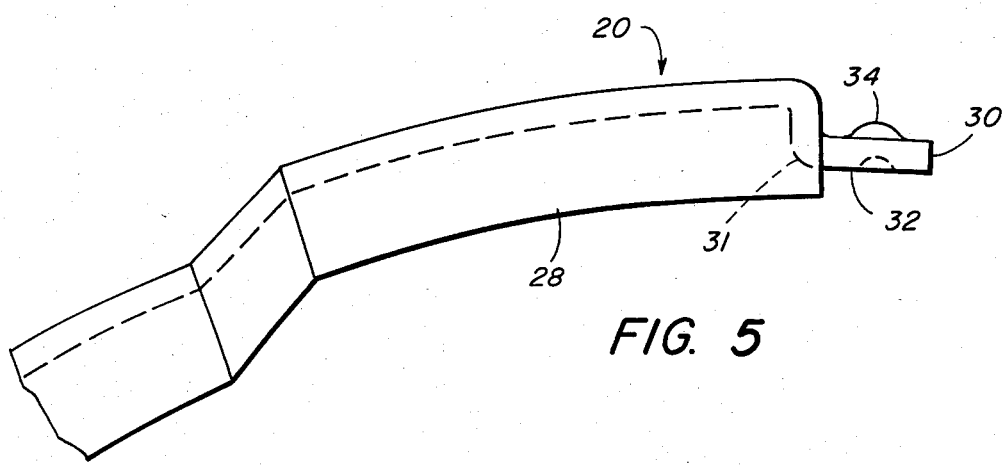
FIG. 5 is a side view, somewhat enlarged, of the male fitting shown in FIG. 4.

The hinge section 20, shown in FIGS. 2, 4 and 5, has a male hinge fitting 24 at one end and a radially extending leg 26 at the other end. Male fitting 24 has an enlarged body 28 and a narrow tongue 30 which extends from the body. The axis of leg 26 has a circular opening 27, which is parallel to the axis of ring 18. Leg 26 and enlarged body 28 both have a U-shaped cross section. However, the width of enlarged body 28 is greater the width of hinge section 20. Tongue 30, a flat L-shaped member having a shoulder 31, is narrower than the hinge section 20. The working end 32 of the tongue 30 is provided with a dimple 34 which protrudes upwardly on the outer surface thereof.

Figure 6:
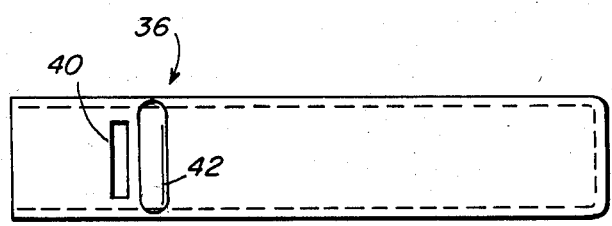
FIG. 6 is a top view of the hinge section which has the female fitting at one end.
Figure 7:
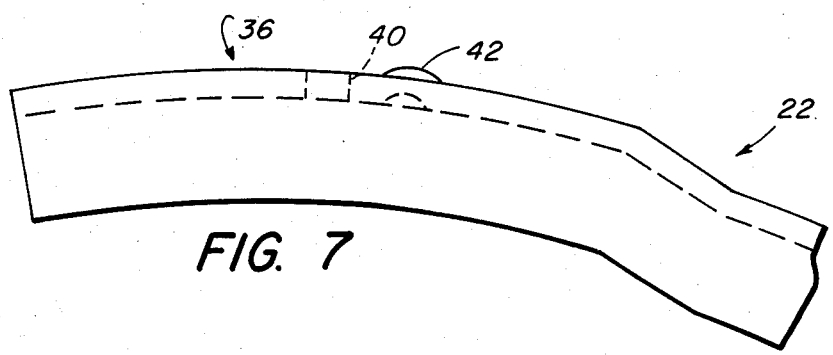
FIG. 7 is a side view, somewhat enlarged, of the female fitting shown in FIG. 6.
Figure 8:
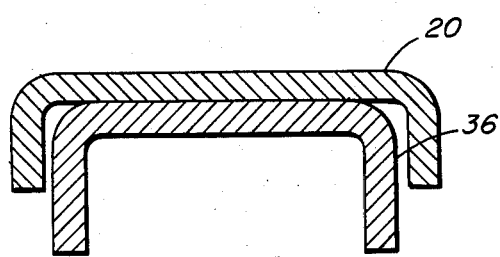
FIG. 8 is a sectional view taken along line 8—8 in FIG. 2.

The hinge section 22, shown in FIGS. 2, 6 and 7, has a female hinge fitting 36 at one end and a radially extending leg 38 at the other end. Female fitting 36 and male fitting 24 are mated hinge fittings. Extending leg 38 is provided with a circular opening 39, the axis of which is parallel to the axis of ring 18. Extending leg 26 with opening 27 and leg 38 with opening 39 are mating members. Hinge section 22, hinge fitting 36 and leg 38 both have a U-shaped cross section. A transverse slot 40 and a transverse depression 42 are provided near the end of female hinge fitting 36.

Figure 9:
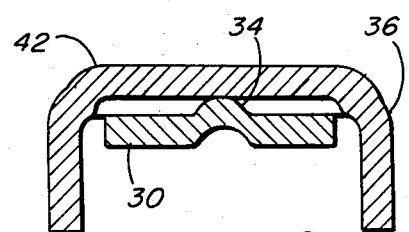
FIG. 9 is a sectional view taken along line 9—9 in FIG. 2.

The slot 40 is positioned between the end of the female hinge fitting and the depression 42. The slot 40 is sized and shaped to receive the tongue 30. Since tongue 30 is L-shaped, it is first inserted downwardly through the slot 40. Then, tongue 30 is pivoted so that shoulder 31 is beneath slot 40 and dimple 34 snaps into the depression 42 (FIGS. 2 and 9). When working end 32 has been inserted through slot 40 and rotated, it is impossible to separate the male hinge fitting 24 and the mating female hinge fitting 36 without performing the procedure in reverse. Nevertheless, the interconnected hinge sections are easily pivoted about the hinge axis to facilitate their mounting on the meter assembly.

As best shown in FIGS. 2 and 3, legs 26 and 38 are equal in length. The distance between the opposite sidewalls of the U-shaped section of leg 38 is greater than the distance between the opposite sidewalls of the U-shaped section of leg 26, the U-shaped section of leg 26 being sized and shaped to fit into the U-shaped section of leg 38. Openings 27 and 39 move into axial alignment when the U-shaped sections of legs 26 and 38 are drawn together. As previously indicated, in order to clamp the glass bowl 16 securely against the meter receptacle 12, the hinge sections of the two piece locking ring 18 are manually separated and then positioned over the facing mating flanges of the glass bowl and the meter receptacle. Because of the hinged interconnection of hinge section 20 and mating hinge section 22, the sections are easily spread apart by the installer. Once the two-piece locking ring 18 is in position over the facing mating flanges of the glass bowl 16 and the meter receptacle 12, the ends of the legs 26, 38 of the locking ring are manually squeezed together until openings 27 and 39 move into axial alignment and the locking ring is snug around the mating flanges of the glass bowl 16 and the meter receptacle 12. The hinged connection of the hinge sections 20 and 22 is such that, when the legs are pulled together, tension is exerted on the connected hinge fittings 24 and 36. This tensional force is such that the shoulder 31 of the tongue 30 is pulled tightly against slot 40 in an interlocking arrangement, thus making it very difficult for vandals to remove the two-piece locking ring. In addition, the hinge sections are fitted together in such a manner that there is no space or opening at the hinged connection. This further hampers unauthorized entry.

A removable, substantially unbreakable, housing 60 is provided to enclose and secure the legs 26 and 38. The housing is preferably plated for corrosion resistance. Housing 60 is sized and shaped to enclose and securely shield the locking ring legs 26 and 38 from unauthorized access by thieves or vandals. The housing 60 is moved upwardly into its locking position by being fitted over the locking ring legs until the housing contacts the lower circumference of the locking ring circular portion as shown in FIG. 2. In this locking position, an extending sleeve 61, which is press fitted into a round front aperture 62 in the housing 60, is in axial alignment with the openings 27 and 39 in extending legs 26 and 38, respectively.

When the housing 60 is in its locking position, as shown in FIGS. 1, 2, and 3, a conventional unlocked barrel lock 64 can be inserted into sleeve 61, through housing aperture 62, and into openings 27 and 39. When the barrel lock 64 is locked, the locking balls 66 extend radially and are confined within the U-shaped section of leg 26 such that barrel lock 64 cannot be pulled axially from its locked position (shown in the drawings).

To install the assembly on an electric meter, the installer manually spreads legs 26 and 38, and then slips locking ring 18 over the facing flanges of the glass bowl and the meter receptacle. Since locking ring 18 is made up of two sections which are interconnected in a hinged arrangement, they are easily spread apart. Next, the installer manually draws the legs together until openings 27 and 39 are axially aligned. When the legs are drawn together, tension is exerted on the hinged connection and shoulder 31 bears against the edge of slot 40. This tensional force, together with the mating interlocked relationship of the male fitting 24 and female fitting 36, leaves no open space, and hampers unauthorized removal of the locking ring.

The housing 60 is then passed up over the legs 26, 38 until the housing reaches its locking position against the lower circumference of the locking ring 18. In this locking position, the sleeve 61 and the aperture 62 of the housing are axially aligned with openings 27 and 39.

A security key is then inserted into the keyway of a conventional (or shortened) barrel lock 64. The key is operated to unlock the barrel lock which is then inserted and pushed into sleeve 61 and housing aperture 62 as far as possible until the barrel lock 64 seats. The sleeve 61 and aperture 62 are sized and shaped to accept with a relatively close fit the full insertion of the barrel lock 64. The rear face of the inserted barrel lock 64 is relatively flush with the outer rim of the housing sleeve 61, thereby reducing the exposure of the barrel lock 64. The barrel lock 64 is then locked by the security key and the key is removed. The locking operation forces the locking balls 66 radially outward into the U-shaped section of leg 26 preventing axial movement of the barrel lock 64 and thereby preventing downward movement of the housing 60. The locking ring 18 is now securely locked and shielded. To remove the locking ring, the installation process is substantially reversed.

The alternative embodiment of the invention shown in FIGS. 10–13 is quite similar to the preferred embodiment in structure, function and operation. A locking ring 80 made according to the alternative embodiment has a hinge section 82 with a male hinge fitting 84 at one end, and has a hinge section 86 with a mating female hinge fitting 88 at one end. The hinge fittings of two-piece locking ring 80 are structurally different from the hinge fittings of the two-piece locking ring 18. The remaining portions of the locking ring assemblies are the same. Since the only differences between the two-piece locking rings are the hinge fittings, FIGS. 10–13 show only the hinge fittings 84 and 88 of the alternative embodiment locking ring 80.

Figure 10:
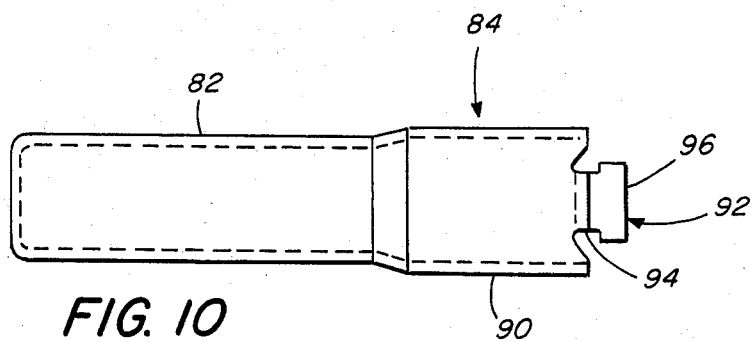
FIG. 10 is a top view of the hinge section which has an alternative embodiment of the male fitting.
Figure 11:
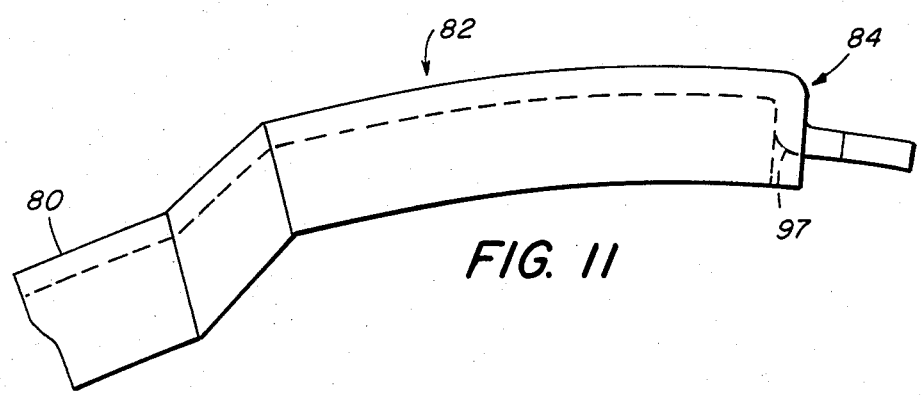
FIG. 11 is a side view, somewhat enlarged, of the male fitting shown in FIG. 10.

The male hinge fitting 84, shown in FIGS. 10 and 11, has an enlarged body 90 which terminates in an extending T-shaped tab 92. Tab 92 has a narrow neck 94 and a wide head 96. The width of enlarged body 90 is greater than the width of the hinge section 82 and the width of head 96 is less than the width of the hinge section. Tab 92 is a flat, L-shaped member having a shoulder 97.

Figure 12:
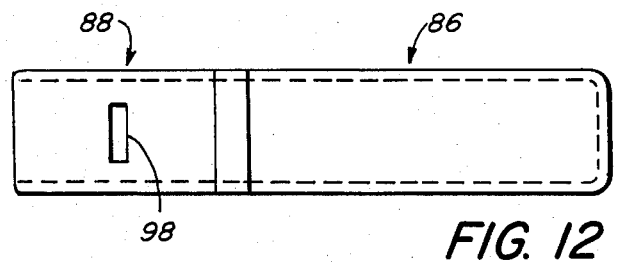
FIG. 12 is a top view of the hinge section which has an alternative embodiment of the female fitting designed to mate with the male fitting shown in FIG. 10.
Figure 13:
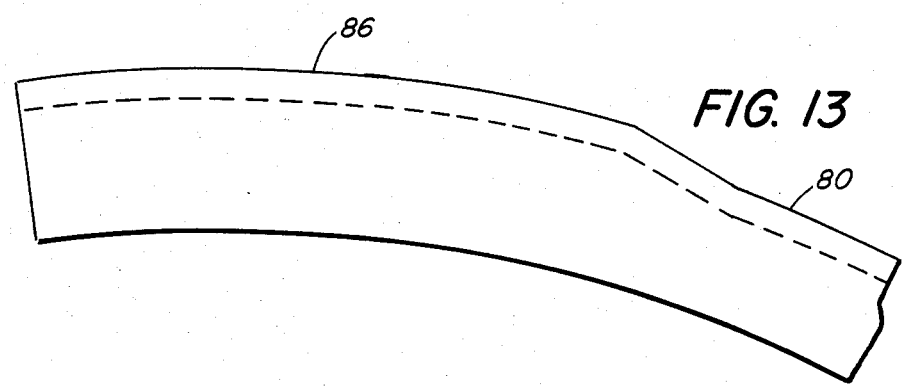
FIG. 13 is a side view, somewhat enlarged, of the female fitting shown in FIG. 12.

The female hinge fitting 88 is shown in FIGS. 12 and 13. A transverse slot 98 is provided near the end of the hinge fitting 88. Since the tab 92 is L-shaped, it is first downwardly inserted through the slot. The width of the neck 94 is less than the width of the slot 98. Therefore, the hinge fitting 84 is inserted into hinge fitting 88 by placing head 96 at an angle relative to slot 98. One end of head 96 is passed through slot 98 and then the other end of the head is passed through the slot. Once the hinge fittings have been interconnected, they cannot be separated unless the hinge sections are twisted. However, the hinge sections are easily pivotally spread apart about the hinge axis for positioning onto the glass bowl and meter receptacle flanges because of their hinged interlocking arrangement. When the two-piece locking ring 80 is clamped onto the meter assembly, shoulder 97 bears against slot 98 to hamper unauthorized removal of the locking ring.

The above description obviously suggests many possible variations and modifications of this invention which would not depart from its spirit and scope. It should be understood, therefore, that the invention is not limited in its application to the details of structures specifically described or illustrated.

What is claimed is:

1. For use with an electric meter having a flanged meter receptacle holding the meter works and a flanged glass bowl covering the meter works, a locking ring assembly for locking the glass bowl to the meter receptacle, the locking ring assembly comprising:
   (a) a two-piece locking ring consisting of two substantially semicircular sections, one of said sections having a hinge fitting at one end and the other of said sections having a mating hinge fitting at one end, said hinge fittings being sized and shaped and fitted together in a hinged arrangement to form a substantially circular locking ring which is configured to clamp the glass bowl flange to the meter receptacle flange;
   (b) a radially extending leg at the other end of each said section, each said leg being formed with an opening, said legs being initially manually separated and then manually squeezed together so that said openings in said legs become axially aligned during positioning and fastening of said locking ring over the flanges of the glass bowl and the meter receptacle, a pulling force being exerted on said hinge fittings when said legs are squeezed together, said glass bowl being clamped to the meter receptacle when said legs are squeezed together;
   (c) lockable shielding means enclosing said legs and securely shielding said legs from unauthorized access;
   (d) one said hinge fitting being a male fitting having an enlarged body and a narrow tongue, and the other said hinge fitting being a female fitting having a transverse slot sized and shaped to tightly receive said narrow tongue; and
   (e) said male hinge fitting narrow tongue having an upwardly protruding dimple, said female hinge fitting having an upwardly protruding transverse depression, said dimple and said depression being positioned to mate when said fittings are interconnected.

2. The locking ring assembly as claimed in claim 1 wherein said locking ring and said legs have U-shaped cross sections.

3. The locking ring assembly as claimed in claim 2 wherein said lockable shielding means includes a removable substantially unbreakable housing for enclosing and securely shielding said locking ring legs against unauthorized access, said housing adapted to be moved into its locking position by being fitted over said locking ring legs and by being positioned closely adjacent to the lower circumference of said circular locking ring, said housing having a round aperture formed in the front of said housing, said housing when in its locking position having its said aperture in axial alignment with said openings in said legs, said housing front aperture being sized and shaped to accept with a relatively close fit the full insertion of a barrel lock, the rear face of the inserted barrel lock being relatively flush with said housing aperture thereby substantially reducing the exposure of the locked barrel lock.

4. The locking ring assembly as claimed in claim 3 wherein one said hinge fitting is a male fitting and has an enlarged body and a narrow tongue, and wherein the other said hinge fitting is a female fitting and has a transverse slot sized and shaped to tightly receive said narrow tongue.

5. The locking ring assembly as claimed in claim 4 wherein said male hinge fitting narrow tongue has an upwardly protruding dimple, and said female hinge fitting has an upwardly protruding transverse depression, said dimple and depression positioned to mate when said fittings are interconnected.

6. The locking ring assembly as claimed in claim 1 wherein one said hinge fitting is a male fitting and has an enlarged body which terminates in a T-shaped tab, and wherein said other hinge fitting is a female fitting and has a transverse slot which is sized and shaped to tightly receive said T-shaped tab.

7. The locking ring assembly as claimed in claim 6 wherein said T-shaped tab has an enlarged head and a narrow neck, the width of said head being greater than the width of said slot, and the width of said neck being less than the width of said slot.

8. For use with an electric meter having a flanged meter receptacle holding the meter works and a flanged glass bowl covering the meter works, a locking ring assembly for locking the glass bowl to the meter receptacle, the locking ring assembly comprising:
   (a) a two-piece locking ring consisting of two substantially semicircular sections, one of said sections having a hinge fitting at one end and the other of said sections having a mating hinge fitting at one end, said hinge fittings being sized and shaped and fitted together in a hinged arrangement to form a substantially circular locking ring which is configured to clamp the glass bowl flange to the meter receptacle flange;
   (b) a radially extending leg at the other end of each said section, each said leg being formed with an opening, the axis of each said opening being parallel to the axis of said ring, said legs being initially manually separated and then manually squeezed together so that said openings in said legs become axially aligned during positioning and fastening of said locking ring over the flanges of the glass bowl and the meter receptacle, a pulling force being exerted on said hinge fittings when said legs are squeezed together, said glass bowl being clamped to the meter receptacle when said legs are squeezed together; and
   (c) lockable shielding means enclosing said legs and securely shielding said legs from unauthorized access.

9. The locking ring assembly as claimed in claim 8 wherein said locking ring and said legs have U-shaped cross sections.

10. The locking ring assembly as claimed in claim 8 wherein said lockable shielding means includes a removable substantially unbreakable housing for enclosing and securely shielding said locking ring legs against unauthorized access, said housing adapted to be moved into its locking position by being fitted over said locking ring legs and by being positioned closely adjacent to the lower circumference of said circular locking ring, said housing having a round aperture formed in the front of said housing, said housing when in its locking position having its said aperture in axial alignment with said openings in said legs, said housing front aperture being sized and shaped to accept with a relatively close fit the full insertion of a barrel lock, the rear face of the inserted barrel lock being relatively flush with said housing aperture thereby substantially reducing the exposure of the locked barrel lock.

11. The locking ring assembly as claimed in claim 8 wherein one said hinge fitting is a male fitting and has an enlarged body which terminates a T-shaped tab, and wherein said other hinge fitting is a female fitting and has a transverse slot which is sized and shaped to tightly receive said T-shaped tab.

12. The locking ring assembly as claimed in claim 11 wherein said T-shaped tab has an enlarged head and a narrow neck, the width of said head being greater than the width of said slot, and the width of said neck being less than the width of said slot.

* * * * *